United States Patent [19]
Fabry et al.

[11] Patent Number: 5,911,889
[45] Date of Patent: Jun. 15, 1999

[54] METHOD OF REMOVING DAMAGED CRYSTAL REGIONS FROM SILICON WAFERS

[75] Inventors: Laszlo Fabry; Bernd Passer, both of Burghausen; Edeltraud Steiger, Falkenberg, all of Germany

[73] Assignee: Wacker Siltronic Gesellschaft für Halbleitermaterialien Aktiengesellschaft, Burghausen, Germany

[21] Appl. No.: 08/629,378

[22] Filed: Apr. 8, 1996

[30] Foreign Application Priority Data

May 11, 1995 [DE] Germany .......................... 195 17 371
May 26, 1995 [DE] Germany .......................... 195 19 455

[51] Int. Cl.⁶ ....................................................... B44C 1/22
[52] U.S. Cl. ............................. 219/90; 216/99; 438/691; 438/747; 438/749; 134/1.3; 134/3
[58] Field of Search ................................ 216/83, 90, 99; 438/691, 747, 749; 134/1.3, 3

[56] References Cited

U.S. PATENT DOCUMENTS

| | | | |
|---|---|---|---|
| 3,224,904 | 12/1965 | Klein | 134/1.3 |
| 3,518,132 | 6/1970 | Glendinning | 438/694 |
| 3,998,653 | 12/1976 | Anthony et al. | 134/1 |
| 4,156,619 | 5/1979 | Griesshammer | 134/2 |
| 4,261,791 | 4/1981 | Schwartzman | 438/694 |
| 4,555,302 | 11/1985 | Urbanik | 216/90 |
| 5,092,937 | 3/1992 | Ogura et al. | 134/30 |
| 5,129,955 | 7/1992 | Tanaka | 134/2 |
| 5,229,334 | 7/1993 | Kato | 438/694 |
| 5,565,060 | 10/1996 | Austin et al. | 216/99 X |
| 5,635,463 | 6/1997 | Muraoka | 510/175 |
| 5,679,171 | 10/1997 | Saga et al. | 134/3 |

FOREIGN PATENT DOCUMENTS

| | | |
|---|---|---|
| 2237825 | 2/1974 | Germany . |
| 2526052 | 12/1976 | Germany . |
| 3328639 | 2/1985 | Germany . |

OTHER PUBLICATIONS

L.D. Dyer, G.J. Grant, C.M. Tripton, A.E. Stephens, Electro–Chem. Soc. Symp. Ser. pp. 296, Jun. 1989, "A Comparison of Silicon Wafer Etching by Kolf and Acid Solutions".

Journal of Electrochemicals Society, Jan. 1, 1989, pp. 296–297 XP 000575047 Dyer et al. "A comparison of silicon water etching by KOH and acid solutions".

English Abstract for DE–A–3328639.

English Abstract for DE 2237825.

I.B.M. Technical Disclosure Bulletin, "Etching with Combined High and Low Frequency Application" Butora et al. p. 667. Nov. 1968.

*Primary Examiner*—Bernard Codd
*Attorney, Agent, or Firm*—Collard & Roe, P.C.

[57] ABSTRACT

A method is provided to remove crystal regions from silicon wafers which are damaged as a consequence of mechanical machining of the silicon wafers. The silicon wafers are pretreated with an aqueous solution containing hydrogen fluoride. Then the wafers are etched in an aqueous solution exposed to ultrasound and containing alkali metal hydroxide at temperatures from 55° C. to 95° C.

16 Claims, No Drawings

METHOD OF REMOVING DAMAGED CRYSTAL REGIONS FROM SILICON WAFERS

BACKGROUND OF THE INVENTION

1. Field of the Invention

The present invention relates to a method for removing crystal regions from silicon wafers which are damaged as a consequence of mechanical machining of the silicon wafers.

2. The Prior Art

This kind of damage to the crystal structure inevitably occurs in the production of silicon wafers. Even as a result of the cutting of individual silicon wafers from a pulled monocrystal with the aid of a sawing tool, for example a wire saw or an annular saw, the subsurface crystal regions of the resulting silicon wafers are damaged down to a depth of approximately 80 $\mu$m. This damage resulting from sawing is, as a rule, reduced by a mechanical surface treatment of the silicon wafers, for example by lapping or grinding the wafers. Lapped or ground silicon wafers therefore only have damage in the crystal structure which extends from the wafer surface down to a depth of approximately 35 $\mu$m into the interior of the wafer. This damage, too, has to be removed completely if it is planned to integrate electronic circuits on the surface of the silicon wafer at a later point in time.

A known method of removing mechanically damaged crystal regions from silicon wafers is based on anisotropic chemical etching of the silicon wafers in an aqueous bath containing, for example, potassium hydroxide and/or sodium hydroxide at temperatures from 100° C. to 120° C. A particular advantage of this method, which is simple to carry out, is that it does not adversely affect the wafer shape and the flatness of the wafer side faces, which are determined by mechanical machining (L. D. Dyer, G. J. Grant, C. M. Tripton, A. E. Stephens, *Electrochem. Soc. Symp. Ser.,* pp. 296, June, 1989).

On the other hand, etching under alkaline conditions is known for the fact that it leaves behind as contaminants foreign metals, which partly originate from the alkali metal hydroxide used, on the wafer surfaces and that such foreign metals diffuse into the interior of the wafers from the etched surface because of the prevailing, relatively high temperatures. Since foreign metal atoms severely interfere with the operation of the electronic components, special care has to be taken in the production of the silicon wafers to ensure that the contamination due to foreign metals is as low as possible. Foreign metals which diffuse into the interior of the wafers during the alkaline etching are therefore a particular problem because they can no longer be removed even by a subsequent cleaning of the wafer surfaces. An improvement in the procedure by using purer alkali metal hydroxides has hitherto been thwarted by the high industrial and economic cost associated with providing such reagents.

SUMMARY OF THE INVENTION

It is an object of the present invention to provide a method for removing damaged crystal regions from silicon wafers which avoids problems in regard to a contamination of the silicon wafers by foreign metals.

The above object is achieved according to the invention by providing a method in which the silicon wafers are pretreated with an aqueous solution containing hydrogen fluoride and are then etched in an aqueous solution exposed to ultrasound and containing alkali metal hydroxide at temperatures from 55° C. to 95° C.

The pretreatment of silicon wafers with aqueous hydrofluoric acid solution and the ultrasonically aided alkaline etching of the silicon wafers performed at relatively low temperatures leave behind only a small, unavoidable concentration of foreign metals on the wafer surfaces. The foreign metals can then be reduced further by known cleaning methods, for example by immersion in a bath of dilute hydrofluoric acid or in dilute nitric acid. The method reliably prevents, however, unacceptable quantities of foreign metals from diffusing into the intact crystal lattice.

Preferably, during the pretreatment, the silicon wafers are immersed in an aqueous solution containing hydrogen fluoride. Immersion times of 60 seconds to 600 seconds, preferably 60 to 180 seconds, are adequate. The temperature of the solution is preferably from 20° C. to 40° C., particularly preferably 25° C. Another embodiment of the method envisages spraying the hydrofluoric acid solution onto the silicon wafers. The proportion of hydrogen fluoride in the solution is preferably from 1% to 5% by weight, particularly preferably from 2% to 4% by weight. It is furthermore to be recommended, but is not absolutely necessary, that the hydrofluoric acid solution contains a surfactant, preferably in a concentration of from 0.05% to 2% by weight, particularly preferably from 0.5% to 1% by weight. The surfactant may be a single compound or a mixture of different single compounds. Suitable examples of surfactants include anionic surfactants such as sulfates. Particularly suitable surfactants are nonylphenol derivatives and ammonium lauryl sulfate. All percents by weight are based upon the total solution weight.

As a result of the pretreatment with dilute hydrofluoric acid, the silicon wafers acquire a hydrophobic surface which offers two particular advantages when etched under alkaline conditions. The damaged crystal regions are removed very uniformly and foreign metals contained as contaminants in the etching solution used later can be adsorbed on the silicon surfaces only to a severely limited extent.

The etching of the silicon wafers following the pretreatment is to be performed under particular conditions. The temperatures in the etching bath in which the silicon wafers to be treated are immersed must be in the range from 55° C. to 95° C., preferably from 75° C. to 80° C. In addition, the etching bath is to be exposed to ultrasonic radiation during the wafer treatment, preferably to ultrasound having a frequency of 20 to 80 kHz, particularly preferably 40 kHz, with a power of 6 to 30 W per liter of aqueous etching solution, preferably 400 W/15 l. At the relatively low bath temperatures, the rate at which foreign metals can diffuse into the interior of the silicon wafers is reduced. The action of the ultrasound levels out a temperature-induced reduced rate of material removal. In the final analysis, the rate at which silicon is removed from the surface of the wafers is higher than the rate at which foreign metals diffuse into the interior of the silicon wafers from the surface.

In principle, the chemical composition of the aqueous etching solution may correspond to one of the known compositions of alkaline etchants. Aqueous solutions of potassium hydroxide and/or sodium hydroxide having an alkali metal hydroxide content of 30% to 50% by weight, in particular 45% to 50% by weight, are preferred. The alkali metal hydroxides used should, of course, have as low as possible a degree of contamination due to foreign metals. However, it is unnecessary for alkali-metal hydroxides to be used which have been freed of foreign metals beyond the extent hitherto usual. All percents by weight are based upon the total solution weight.

The silicon wafers treated by the method according to the invention are similar to the acid-etched silicon wafers with regard to the low residual contamination with foreign metals. However, because of their etching kinematics, methods in which acids are used to etch silicon wafers result in undesirable alterations in the wafer geometry and are substantially more expensive in relation to costs incurred for safety at work and environmental protection.

While several embodiments of the present invention have been shown and described, it is to be understood that many changes and modifications may be made thereunto without departing from the spirit and scope of the invention as defined in the appended claims.

What is claimed is:

1. Method for removing crystal regions from silicon wafers which are damaged as a consequence of mechanical machining of the silicon wafers, consisting essentially of the steps of pretreating the silicon wafers with a solution consisting of water and hydrogen fluoride; and etching the silicon wafers in an aqueous etching solution containing an alkali metal hydroxide at temperatures from 55° C. to 95° C., while exposing the aqueous etching solution to ultrasound.

2. Method according to claim 1, comprising etching the silicon wafers in said aqueous solution of an alkali metal hydroxide selected from the group consisting of potassium hydroxide, sodium hydroxide, and the mixtures thereof.

3. Method according to claim 1, comprising:

exposing the aqueous solution containing alkali metal hydroxide to ultrasound having a frequency of 20 to 80 kHz.

4. Method according to claim 1, wherein the temperature in said aqueous etching solution ranges from 75° C. to 80° C.

5. Method according to claim 1, wherein the ultrasound is applied with a power of 6 to 30 W per liter.

6. Method according to claim 1, wherein the aqueous etching solution contains from 30% to 50% by weight of alkali metal hydroxide, based upon the total solution weight.

7. Method for removing crystal regions from silicon wafers which are damaged as a consequence of mechanical machining of the silicon wafers, consisting essentially of the steps of pretreating the silicon wafers with a solution consisting of water and from 1% to 5% by weight of hydrogen fluoride and from 0.05% to 2% by weight of a surfactant, based upon the total solution weight; and etching the silicon wafers in an aqueous etching solution containing an alkali metal hydroxide at temperatures from 55° C. to 95° C., while exposing the aqueous etching solution to ultrasound.

8. Method according to claim 7, wherein said surfactant comprises an anionic surfactant.

9. Method according to claim 8, wherein said anionic surfactant is a sulfate.

10. Method according to claim 9, wherein said anionic surfactant is an ammonium lauryl sulfate.

11. Method according to claim 7, wherein said surfactant is a nonylphenyl.

12. Method for removing crystal regions from silicon wafers which are damaged as a consequence of mechanical machining of the silicon wafers, consisting essentially of the steps of pretreating the silicon wafers by spraying onto surfaces of the silicon wafers, a solution consisting of water and from 1% to 5% by weight of hydrogen fluoride and from 0.05% to 2% by weight of a surfactant, based upon the total solution weight; and etching the silicon wafers in an aqueous etching solution containing an alkali metal hydroxide at temperatures from 55° C. to 95° C., while exposing the aqueous etching solution to ultrasound.

13. Method according to claim 12, wherein said surfactant comprises an anionic surfactant.

14. Method according to claim 13, wherein said anionic surfactant is a sulfate.

15. Method according to claim 14, wherein said anionic surfactant is an ammonium lauryl sulfate.

16. Method according to claim 12, wherein said surfactant is a nonylphenyl.

\* \* \* \* \*